United States Patent
Yang et al.

(10) Patent No.: US 10,297,603 B2
(45) Date of Patent: May 21, 2019

(54) STATIC RANDOM ACCESS MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Xiao Lei Yang, Shanghai (CN); Yong Li, Shanghai (CN); Jian Hua Ju, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/032,838

(22) Filed: Jul. 11, 2018

(65) Prior Publication Data

US 2018/0323201 A1 Nov. 8, 2018

Related U.S. Application Data

(62) Division of application No. 15/407,387, filed on Jan. 17, 2017.

(30) Foreign Application Priority Data

Feb. 4, 2016 (CN) .......................... 2016 1 0080737

(51) Int. Cl.
*H01L 27/088* (2006.01)
*H01L 27/11* (2006.01)

(52) U.S. Cl.
CPC ............................... *H01L 27/1104* (2013.01)

(58) Field of Classification Search
CPC .................................................... H01L 27/1104
USPC ......................................................... 257/393
See application file for complete search history.

(56) References Cited

U.S. PATENT DOCUMENTS

| | | |
|---|---|---|
| 6,133,084 A | 10/2000 | Chang et al. |
| 8,525,270 B2 | 9/2013 | Teo et al. |
| 8,859,355 B1 | 10/2014 | Leobandung |
| 9,356,121 B2 | 5/2016 | Jagannathan et al. |
| 9,620,507 B2 | 4/2017 | Loubet et al. |

(Continued)

*Primary Examiner* — Anthony Ho
*Assistant Examiner* — Mohammad M Hoque
(74) *Attorney, Agent, or Firm* — Anova Law Group, PLLC (57) ABSTRACT

An SRAM includes a substrate containing a plurality of first substrate regions and a plurality of second substrate regions, a plurality of pull-down transistors formed in the first substrate regions with each pull-down transistor including a first gate structure, and a plurality of pass-gate transistors formed in the second substrate regions with each pass-gate transistor including a second gate structure. A portion of the first substrate region under each first gate structure is doped with first doping ions and a portion of the second substrate region under each second gate structure is doped with second doping ions. Moreover, the concentration of the first doping ions is less than the concentration of the second doping ions, and the work function of the first work function layer in the first gate structures is greater than the work function of the second work function layer in the second gate structures.

19 Claims, 5 Drawing Sheets

(56) References Cited

U.S. PATENT DOCUMENTS

| | | |
|---|---|---|
| 9,620,610 B1 | 4/2017 | Jangjian et al. |
| 2011/0193173 A1 | 8/2011 | Nii et al. |
| 2011/0317485 A1 | 12/2011 | Liaw |
| 2012/0205727 A1 | 8/2012 | Kanakasabapathy et al. |
| 2012/0217588 A1 | 8/2012 | Vega |
| 2013/0168776 A1 | 7/2013 | Liang et al. |
| 2013/0313648 A1 | 11/2013 | Chiang et al. |
| 2014/0048881 A1 | 2/2014 | Kanike et al. |
| 2014/0070333 A1 | 3/2014 | Cheng et al. |
| 2014/0264480 A1 | 9/2014 | Tsao et al. |
| 2014/0273386 A1 | 9/2014 | Tsao et al. |
| 2015/0228762 A1 | 8/2015 | He et al. |
| 2015/0236159 A1 | 8/2015 | He et al. |
| 2015/0263045 A1 | 9/2015 | Leobandung |
| 2015/0333061 A1 | 11/2015 | Kim et al. |
| 2015/0340326 A1 | 11/2015 | Lytle et al. |
| 2016/0064225 A1 | 3/2016 | Kim et al. |
| 2016/0104645 A1 | 4/2016 | Hung et al. |
| 2016/0197202 A1 | 7/2016 | Tomai et al. |
| 2016/0225675 A1 | 8/2016 | Shen et al. |
| 2016/0343825 A1 | 11/2016 | Bae et al. |
| 2016/0365347 A1 | 12/2016 | Bao et al. |
| 2017/0162570 A1 | 6/2017 | Shih et al. |

STATIC RANDOM ACCESS MEMORY AND FABRICATION METHOD THEREOF

CROSS-REFERENCES TO RELATED APPLICATIONS

This application is a divisional of U.S. patent application Ser. No. 15/407,387, filed on Jan. 17, 2017, which claims the priority of Chinese Patent Application No. CN201610080737.8, filed on Feb. 4, 2016, the entire content of which is incorporated herein by reference.

FIELD OF THE DISCLOSURE

The present disclosure generally relates to the field of semiconductor technologies and, more particularly, relates to a static random access memory and fabrication methods thereof.

BACKGROUND

With the development of information technology, the amount of information to be stored increases dramatically. The expansion of the stored information not only promotes the rapid development of memories but also requires higher stability of memories.

Currently, static random access memory (SRAM) is one of the most popular memories for information storage. A storage unit of an SRAM may include four or six transistors. That is, the storage unit may have a 4T structure or a 6T structure. Storage units having either the 4T structure or the 6T structure may all include one or more pull-down transistors and one or more pass-gate transistors. Specifically, the pull-down transistors may be used to store data while the pass-gate transistors may be used to read and write data.

In order to have sufficient anti-interference ability and desired read stability, fin field-effect transistors (Fin-FETs) are commonly used to form memories. In a Fin-FET, the gate electrode has a three-dimensional (3D) structure covering three surfaces of the fin structure such that circuit control may be significantly improved. The application of Fin-FETs in memories may improve the stability of data storage and the integration level of the memories.

However, existing memories may still face problems including small static noise margin, poor read stability, etc. The disclosed static random access memories and the fabrication methods are directed to solve one or more problems set forth above and other problems in the art.

BRIEF SUMMARY OF THE DISCLOSURE

One aspect of the present disclosure includes an SRAM. The SRAM includes a substrate containing a plurality of first substrate regions and a plurality of second substrate regions, a plurality of pull-down transistors formed in the first substrate regions with each pull-down transistor including a first gate structure, and a plurality of pass-gate transistors formed in the second substrate regions with each pass-gate transistor including a second gate structure. The first gate structure includes a first gate dielectric layer, a first gate electrode layer formed above the first gate dielectric layer, and a first work function layer formed between the first gate electrode layer and the first gate dielectric layer; while the second gate structure includes a second gate dielectric layer, a second gate electrode layer formed above the second gate dielectric layer, and a second work function layer formed between the second gate electrode layer and the second gate dielectric layer. The first gate dielectric layer and the second gate dielectric layer are made of a same material and the thickness of the first gate dielectric layer is also the same as the thickness of the second gate dielectric layer. Further, a portion of the first substrate region under each first gate structure is doped with first doping ions and a portion of the second substrate region under each second gate structure is doped with second doping ions. Moreover, the concentration of the first doping ions is less than the concentration of the second doping ions and the work function of the first work function layer is greater than the work function of the second work function layer.

Another aspect of the present disclosure provides a method for fabricating an SRAM. The method includes providing a substrate including a plurality of first substrate regions and a plurality of second substrate regions, forming a first doped region in each first substrate region by implanting first doping ions, forming a second doped region in each second substrate region by implanting second doping ions, forming a plurality of pull-down transistors in the first substrate regions with each pull-down transistor including a first gate structure formed on the first doping region, and forming a plurality of pass-gate transistors in the second substrate regions with each pass-gate transistor including a second gate structure formed on the second doping region. Further, forming the first gate structure includes forming a first gate dielectric layer on the first doping region, forming a first work function layer on the first gate dielectric layer, and forming a first gate electrode layer on the first work function layer, and forming the second gate structure includes forming a second gate dielectric layer on the second doping region, forming a second work function layer on the second gate dielectric layer, and forming a second gate electrode layer on the second work function layer. The first gate dielectric layer and the second gate dielectric layer are made of a same material and the thickness of the first gate dielectric layer is also the same as the thickness of the second gate dielectric layer. Moreover, the concentration of the first doping ions is smaller than the concentration of the second doping ions, and the work function of the first work function layer is greater than the work function of the second work function layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Existing memories may have a small static noise margin. In the following, an example will be provided to illustrate the reason that may cause such a small static noise margin in existing memories.

The noise margin of a memory is related to the beta ratio of the memory. Specifically, the larger the beta ratio is, the larger the static noise margin should be. Further, memories with a larger static noise margin may demonstrate better anti-interference ability. The beta ratio is defined by the ratio between the saturation current of the pull-down transistor and the saturation current of the pass-gate transistor in a memory unit. According to existing memories, the pull-down transistor and the pass-gate transistor have similar structures and the saturation current of the pull-down transistor is also close to the saturation current of the pass-gate transistor. Therefore, further raising the beta ratio in existing memories may be difficult, which limits the improvement of the static noise margin of existing memories.

Figure 1:
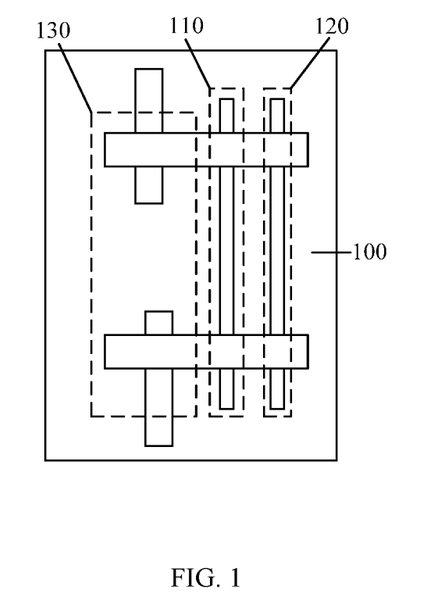
FIG. 1 illustrates a schematic view of an exemplary SRAM consistent with disclosed embodiments.

In view of the problem described above, the present disclosure provides an SRAM to increase the beta ratio and thus improve the static noise margin. FIG. 1 shows a schematic view of an exemplary SRAM consistent with disclosed embodiments.

Referring to FIG. 1, the SRAM may include a plurality of pull-down transistors 110 and a plurality of pass-gate transistors 120. The SRAM may be formed on a substrate 100. The substrate 100 may include a plurality of first substrate regions used to form the pull-down transistors 110 and a plurality of second substrate regions used to form the pass-gate transistors 120.

In one embodiment, the memory may include a plurality of memory units. For illustration purposes, only one memory unit is shown in FIG. 1. In addition, each memory unit shown in FIG. 1 may have a 6T structure. Specifically, the memory unit may include a pair of pull-down transistors 110, a pair of pull-up transistors 130, and a pair of pass-gate transistors 120. That is, in addition to pull-down transistors 110 and pass-gate transistors 120, the memory may also include pull-up transistors 130. In other embodiments, the memory may also include memory units with a 4T structure. That is, each memory unit may include a pair of pull-down transistors and a pair of pass-gate transistors.

The static noise margin of the memory may be related to the threshold voltage of the pull-down transistor 110 and the threshold voltage of the pass-gate transistor 120. When the threshold voltages of the pull-down transistor 110 and the pass-gate transistor 120 are around a half of the working voltage, the static noise margin may reach a maximum value. When the threshold voltages of the pull-down transistor 110 and the pass-gate transistor 120 deviate from a half of the working voltage, the static noise margin of the memory may be reduced, and thus the stability of the memory may be affected.

Specifically, in one embodiment, the working voltage of the pull-down transistor 110 and the pass-gate transistor 120 may be in a range between 0.6 V and 0.8 V. Therefore, the threshold voltage of the pull-down transistor 110 and the threshold voltage of the pass-gate transistor 120 may be designed to be in a range between 0.3 V and 0.4 V in order to ensure a relatively large static noise margin.

In one embodiment, the transistors used to form the plurality of memory units of the memory may all be Fin-FETs in order to reduce the size of the memory, improve the integration level, and improve the stability of data storage.

In other embodiments, the transistors used to form the memory may all be or may partially be planar transistors.

Further, in one embodiment, two pull-down transistors 110 may have a common fin structure and two pass-gate transistors 120 may have a common fin structure. In other embodiments, the two pull-down transistors 110 may have two separated fin structures while the two pass-gate transistors 120 may also have two separated fin structures.

In one embodiment, the substrate 100 may be a silicon substrate. In other embodiment, the substrate may also be made of germanium (Ge), silicon germanium (SiGe), silicon on insulator (SOI), or any other appropriate semiconductor.

Figure 2:
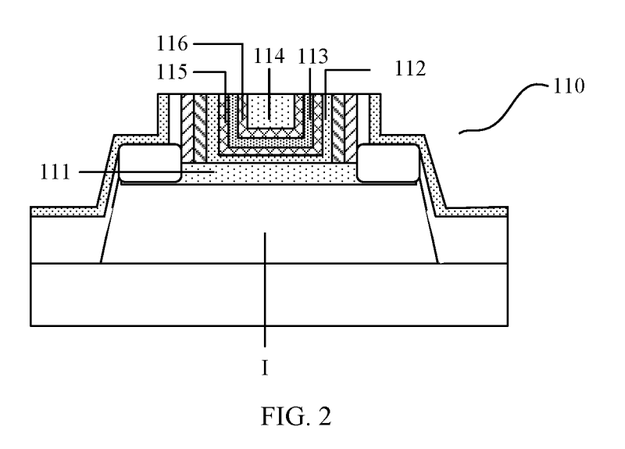
FIG. 2 illustrates a schematic cross section view of a pull-down transistor included in the SRAM shown in FIG. 1 consistent with disclosed embodiments.

FIG. 2 shows a schematic cross-section view of a pull-down transistor 110 in the memory shown in FIG. 1. Referring to FIG. 2, the pull-down transistor 110 may include a first fin structure I situated on the first substrate region. The first fin structure I may be used to form the channel of the pull-down transistor 110.

In one embodiment, the first fin structure I may be made of a same material as the first substrate region made of. For example, both the first fin structure I and the first substrate region may be made of silicon. In other embodiments, the first fin structure I may be made of a material different from the material of the first substrate region. For example, when the first substrate region is made of silicon, the first fin structure I may be made of Ge, SiGe, SOI, or any other appropriate semiconductor material different from silicon.

In one embodiment, the pull-down transistor 110 may be a Fin-FET. Therefore, the pull-down transistor 110 may include the first fin structure I on the first substrate region. In other embodiments, the pull-down transistor may be a planar transistor without a fin structure.

The pull-down transistor 110 may also include a first gate structure formed across the first fin structure I and covering the sidewalls and the top of the first fin structure I. Further, the portion of the first substrate region under the first gate structure may be doped with first doping ions 111. In one embodiment, the pull-down transistor 110 is an NMOS transistor, and the first doping ions 111 are boron ions.

The doping concentration of the first doping ions 111 may not be too large or too small. When the doping concentration of the first doping ions 111 is too large, charge carriers scattering in the channel of the pull-down transistor 110 due to the first doping ions may be strong such that the saturation current of the pull-down transistor 110 may be reduced, and thus the static noise margin of the memory may also be reduced. When the doping concentration of the first doping ions 111 is too small, while ensuring a certain threshold voltage for the pull-down transistor 110, the thickness of a first function layer in the pull-down transistor 110 may be too small so that the formation process for the first function layer may be difficult. Therefore, in one embodiment, the concentration of the first doping ions 111 may be in a range between $10^{15}$ atom/cm$^{-3}$ and $10^{17}$ atom/cm$^{-3}$.

The first gate structure may include a first gate dielectric layer 112 and a first gate electrode 114 formed on the first gate dielectric layer 112. When a certain threshold voltage of the pull-down transistor 110 is ensured, the thickness of the first gate dielectric layer 112 may affect the saturation current of the pull-down transistor 110. In one embodiment, the first gate dielectric layer 112 may be made of a same dielectric material as gate dielectric layers formed in devices in existing semiconductor chips. As such, the saturation current of the pull-down transistor 110 may be increased and, in the meantime, the complexity of controlling the threshold voltage of the pull-down transistor 110 may be reduced.

Specifically, in one embodiment, the first gate dielectric layer 112 may have a multi-layer structure formed by a gate oxide layer and a high-k dielectric layer. The gate oxide layer may be used to reduce the interface-state density between the high-k dielectric layer and the first fin structure I. The high-k dielectric layer may reduce the leak current and impurity diffusion in the pull-down transistor 110, and thus improve the integration level of the semiconductor device. The thickness of the first gate dielectric layer 112 may be in a range of 5 Å to 30 Å.

In one embodiment, the first gate electrode 114 may be made of a titanium-aluminum alloy. The influence of the material of the first gate electrode 114 on the threshold voltage of the pull-down transistor 110 may need to be considered when adjusting the first work function of the first work function layer.

The first gate structure may also include a first work function layer 113 formed between the first gate electrode 114 and the first gate dielectric layer 112. The first work function layer 113 may have a first work function.

The first work function layer 113 may be used to adjust the saturation current of the pull-down transistor 110 and the static noise margin of the memory through the control of the threshold voltage of the pull-down transistor 110.

When a certain threshold voltage of the pull-down transistor 110 is ensured, the beta ratio of the memory may be related to the first work function of the first work function layer 113. Further, in order to ensure a low concentration for the first doping ions 111 when the pull-down transistor 110 has a certain threshold voltage, the first work function layer 113 may be selected after comprehensively considering the influence of the first gate electrode 114, the material and the thickness of each layer between the first electrode 114 and the first fin structure I on the threshold voltage of the pull-down transistor 110. In one embodiment, by adjusting the material and the thickness of the first work function layer 113, the first work function layer 113 may have a relatively large first work function. Specifically, the first work function of the first work function layer 113 may be in a range between 4.3 V and 4.4 V.

In one embodiment, to ensure a relatively large first work function for the first work function layer 113 and also considering the requirement of the fabrication process for the first work function layer 113, the first work function layer 113 is made of a titanium-aluminum alloy. Specifically, in the titanium-aluminum alloy, the atomic percentage of aluminum atoms may be in a range of 50% to 60%. In other embodiments, the first work function layer 113 may be made of any other titanium-aluminum alloy with a different titanium-to-aluminum ratio, or may be made of any other appropriate material.

In one embodiment, in order to ensure the first work function of the first work function layer 113 in the range between 4.3 V and 4.4 V, the thickness of the first work function layer 113 may be in a range of 10 Å to 20 Å. In other embodiments, the thickness of the first work function layer may be selected based on the material of the first work function layer to ensure a desired large first work function for the first work function layer.

In one embodiment, the first gate structure may also include a first cap layer formed between the first gate dielectric layer 112 and the first work function layer 113. The first cap layer 115 may be used to electrically isolate the first work function layer 113 from the first gate dielectric layer 112.

When a certain threshold voltage of the pull-down transistor 110 is ensured, the material of the first cap layer 115 may affect the saturation current of the pull-down transistor 110, and thus may affect the static noise margin of the memory. In one embodiment, the first cap layer 115 is made of titanium nitride.

Further, when the thickness of the first cap layer 115 is too small, the electrical isolation between the first work function layer 113 and the first gate dielectric layer 112 may not be sufficient. However, when the thickness of the first cap layer 115 is too large, the device design may not be conducive to integration. Therefore, in one embodiment, the thickness of the first cap layer 115 is in a range of 5 Å to 50 Å.

In one embodiment, the first gate structure may also include a third cap layer 116 formed between the first work function layer 113 and the first gate electrode 114. The third cap layer 116 may be used to electrically isolate the first work function layer 113 from the first gate electrode 114.

When a certain threshold voltage of the pull-down transistor 110 is ensured, the material of the third cap layer 116 may affect the saturation current of the pull-down transistor 110, and thus may affect the static noise margin of the memory. In one embodiment, the third cap layer 116 is made of titanium nitride.

Further, when the thickness of the third cap layer 116 is too small, the electrical isolation between the first work function layer 113 and the first gate electrode 114 may not be sufficient. However, when the thickness of the third cap layer 116 is too large, the device design may not be conducive to integration. Therefore, in one embodiment, the thickness of the third cap layer 116 is in a range of 5 Å to 50 Å.

Figure 3:
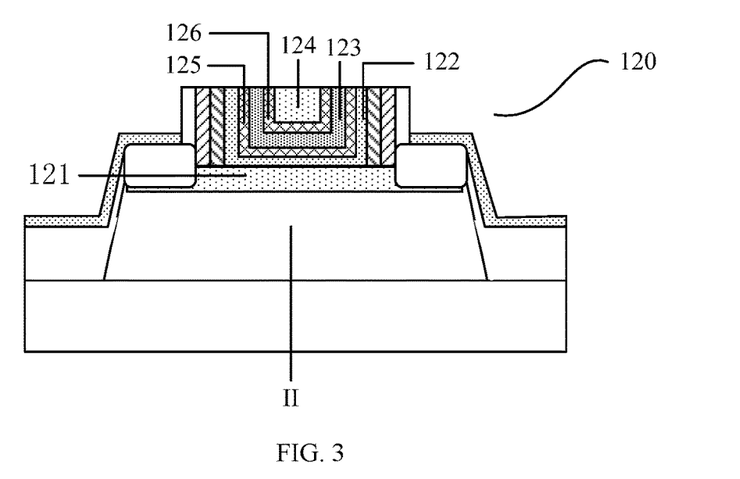
FIG. 3 illustrates a schematic cross section view of a pass-gate transistor included in the SRAM shown in FIG. 1 consistent with disclosed embodiments.

FIG. 3 shows a schematic cross section view of a pass-gate transistor 120 included in the SRAM shown in FIG. 1. The pass-gate transistor 120 may include a second fin structure II situated on the second substrate region. The second fin structure II may be used to form the channel of the pass-gate transistor 120.

In one embodiment, the second fin structure II may be made of a same material as the second substrate region made of. For example, both the second fin structure II and the second substrate region may be made of silicon. In other embodiments, the second fin structure II may be made of a material different from the material of the second substrate region. For example, when the second substrate region is made of silicon, the second fin structure II may be made of Ge, SiGe, SOI, or any other appropriate semiconductor material different from silicon.

In one embodiment, the pass-gate transistor 120 may be a Fin-FET. Therefore, the pass-gate transistor 120 may include the second fin structure II on the second substrate region. In other embodiments, the pass-gate transistor may be a planar transistor without a fin structure.

The pass-gate transistor 120 may also include a second gate structure formed across the second fin structure II and covering the sidewalls and the top of the second fin structure II. Further, the portion of the second substrate region under the second gate structure may be doped with second doping ions 121. In one embodiment, the pass-gate transistor 120 is an NMOS transistor, and the second doping ions 121 are boron ions.

The concentration of the first doping ions 111 (referring to FIG. 2) may be smaller than the concentration of the second doping ions 121 so that charge carrier scattering in the pull-down transistor 110 due to the first doping ions 111 may be weaker than charge carrier scattering in the pass-gate transistor 120 due to the second doping ions 121. Therefore, the saturation current of the pull-down transistor 110 may be larger than the saturation current of the pass-gate transistor 120, and thus the beta ratio of the memory may be increased and the static noise margin may be improved.

Further, the doping concentration of the second doping ions 121 may not be too small or too large. When the doping concentration of the second doping ions 121 is too small, the saturation current of the pass-gate transistor 120 may be large, and the static noise margin of the memory may be reduced. When the doping concentration of the second doping ions 121 is too large, the performance of the memory may be affected. Therefore, in one embodiment, the concentration of the second doping ions 121 may be in a range between $10^{17}$ atom/cm$^{-3}$ and $10^{18}$ atom/cm$^{-3}$. For such a concentration of the second doping ions 121, the saturation current of the pass-gate transistor 120 may be small and the beta ratio of the memory may be large.

The second gate structure may include a second gate dielectric layer 122 and a second gate electrode 124 formed on the second gate dielectric layer 122. The second gate dielectric layer 122 may be used to electrically isolate the second gate electrode 124 from the second fin structure II.

The thickness of the second gate dielectric layer 122 may affect the threshold voltage of the pass-gate transistor 120, and thus may further affect the saturation current of the pass-gate transistor 120. In one embodiment, in order to reduce the complexity of controlling the threshold voltage of the pass-gate transistor 120, the second gate dielectric layer 122 may be made of a same dielectric material as the first gate dielectric layer 112 (referring to FIG. 2), and the thickness of the second gate dielectric layer 122 may also be the same as the thickness of the first gate dielectric layer 112.

In one embodiment, the second gate dielectric layer 122 may have a multi-layer structure formed by a gate oxide layer and a high-k dielectric layer. The gate oxide layer may be used to reduce the interface-state density between the high-k dielectric layer and the second fin structure II. The high-k dielectric layer may reduce the leak current and impurity diffusion in the pass-gate transistor 120, and thus improve the integration level of the semiconductor device. The thickness of the second gate dielectric layer 122 may be in a range of 5 Å to 30 Å.

In one embodiment, the second gate electrode 124 may be made of a same material as the first gate electrode 114 (referring to FIG. 2) made of. As such, the fabrication process for the second gate electrode 124 and the first gate electrode 114 may be simplified. In the meantime, making the second gate electrode 124 identical to the first gate electrode 114 may have limited influence on the beta ratio of the memory, and thus may reduce the complexity of adjusting the work functions of the first work function layer 113 and the second work function layer 123.

The second gate structure may also include a second work function layer 123 formed between the second gate electrode 124 and the second gate dielectric layer 122. The second work function layer 123 may have a second work function.

The first work function may be larger than the second work function. As such, when certain threshold voltages of the pull-down transistor 110 and the pass-gate transistor 120 are ensured, the concentration of the first doping ions 111 may be smaller than the concentration of the second doping ions 121. Therefore, the saturation current of the pull-down transistor 110 may be larger than the saturation current of the pass-gate transistor 120, and thus the static noise margin of the memory may be improved.

The second work function layer 123 may be used to adjust the saturation current of the pass-gate transistor 120 through the control of the threshold voltage of the pass-gate transistor 120.

When a certain threshold voltage of the pass-gate transistor 120 is ensured, the beta ratio of the memory may be related to the second work function of the second work function layer 123. Further, in order to ensure a high concentration for the second doping ions 121 when the pass-gate transistor 120 has a certain threshold voltage, the second work function layer 123 may be selected after comprehensively considering the influence of the second gate electrode 124, the material and the thickness of each layer between the second electrode 124 and the second fin structure II on the threshold voltage of the pass-gate transistor 120. In one embodiment, by adjusting the material and the thickness of the second work function layer 123, the second work function of the second work function layer 123 may have a certain value. Specifically, the second work function of the second work function layer 123 may be in a range between 4.2 V and 4.3 V.

In one embodiment, to ensure the certain value of the second work function for the second work function layer 123 and also considering the requirement of the fabrication process for the second work function layer 123, the second work function layer 123 may be made of the same material as the first work function layer 113 (referring to FIG. 2) made of That is, the second work function layer 123 may also be made of a titanium-aluminum alloy. Specifically, in the titanium-aluminum alloy, the atomic percentage of aluminum atoms may be in a range of 50% to 60%. In other embodiments, the second work function layer 123 may be made of any other titanium-aluminum alloy with a different titanium-to-aluminum ratio, or may be made of any other appropriate material.

In an N-type transistor, a larger thickness of the work function layer may correspond to a smaller work function. In one embodiment, the first work function layer 113 and the second work function layer 123 are both made of a same material. In order to ensure the second work function of the second work function layer 123 smaller than the first work function of the first work function layer 113, the thickness of the second work function layer 123 may be larger than the thickness of the first work function layer 113. Specifically, the thickness of the second work function layer 123 may be in a range of 20 Å to 50 Å. In other embodiments, the thickness of the second work function layer may be selected based on the material of the second work function layer to ensure a smaller second work function for the second work function layer as compared to the first work function of the first work function layer.

In one embodiment, the second gate structure may also include a second cap layer 125 formed between the second gate dielectric layer 122 and the second work function layer 123. The second cap layer 125 may be used to electrically isolate the second work function layer 123 from the second gate dielectric layer 122.

Specifically, in one embodiment, the second cap layer 125 may be made of the same material the first cap layer 115 (referring to FIG. 2) made of, and the thickness of the second cap layer 125 may also be the same as the thickness of the first cap layer 115. As such, the fabrication process for the second cap layer 125 and the first cap layer 115 may be simplified. In the meantime, making the second cap layer 125 identical to the first cap layer 115 may have limited influence on the beta ratio of the memory, and thus may reduce the complexity of adjusting the work functions of the first work function layer 113 and the second work function layer 123.

In one embodiment, the second gate structure may also include a fourth cap layer 126 formed between the second work function layer 123 and the second gate electrode 124. The fourth cap layer 126 may be used to electrically isolate the second work function layer 123 from the second gate electrode 124.

Specifically, the fourth cap layer 126 may be made of the same material the third covering layer 116 (referring to FIG. 2) made of, and the thickness of the fourth cap layer 126 may also be the same as the thickness of the third cap layer 116. As such, the fabrication process for the fourth cap layer 126 and the third cap layer 116 may be simplified. In the meantime, making the fourth cap layer 126 identical to the third cap layer 116 may have limited influence on the beta ratio of the memory, and thus may reduce the complexity in adjusting the work functions of the first work function layer 113 and the second work function layer 123.

The first gate dielectric layer 112, the second gate dielectric layer 122, the first cap layer 115, the second cap layer 125, the third cap layer 116, the fourth cap layer 126, the first gate electrode 114, and the second gate electrode may all have influence on the threshold voltage of the corresponding transistor in the memory. In one embodiment, the work functions of the first work function layer 113 and the second work function layer 123 may be adjusted when specific selections on the material and the thickness have been made for the first gate dielectric layer 112, the second gate dielectric layer 122, the first cap layer 115, the second cap layer 125, the third cap layer 116, the fourth cap layer 126, the first gate electrode 114, and the second gate electrode 124. Specifically, when certain threshold voltages of the pull-down transistor 110 and the pass-gate transistor 120 are ensured, adjusting the work functions of the first work function layer 113 and the second work function layer 123 may result in a low concentration for the first doping ions 111 and a high concentration for the second doping ions 121 such that the beta ratio of the memory may be increased, and thus the static noise margin of the memory may also be improved.

In other embodiments, each of the first gate dielectric layer, the second gate dielectric layer, the first cap layer, the second cap layer, the third cap layer, the fourth cap layer, the first gate electrode, and the second gate electrode may be made of any other appropriate material with a proper thickness. Accordingly, the work functions of the first work function layer and the second function layer may be adjusted based on the selections of the materials and the thicknesses. As such, the certain threshold voltages of the pull-down transistor and the pass-gate transistor are ensured, the concentrations of the first doping ions and the second doping ions may be changed so that the beta ration of the memory may be increased, and the static noise margin of the memory may be improved.

In one embodiment, for illustration purposes, the threshold voltages of the pull-down transistor 110 and the pass-gate transistor 120 are both described to be approximately a half of the working voltage. In another embodiment, the pull-down transistor may have a same structure as the pull-down transistor described above, while the threshold voltage of the pass-gate transistor may not be around a half of the working power. In addition, the concentration of the second doping ions may be higher than $10^{18}$ atom/cm$^{-3}$. That is, the pass-gate transistor may be consistent with pass-gate transistors in existing memories.

Moreover, in other embodiments, the pass-gate transistor may have a same structure as the pass-gate transistor described above while the pull-down transistor may be consistent with pull-down transistors in existing memories.

Therefore, the pull-down transistor in the disclosed SRAM may include the first work function layer and the pass-gate transistor may include the second function layer. In addition, by ensuring the first work function of the first work function layer larger than the second work function of the second work function layer, the concentration of the first doping ions may be smaller than the concentration of the second doping ions so that charge carrier scattering in the pull-down transistor may be weaker than charge carrier scattering in the pass-gate transistor. As such, the ratio between the saturation current of the pull-down transistor to the saturation current of the pass-gate transistor may be improved, and thus the beta ratio of the memory may be increased and the static noise margin of the memory may also be improved.

Further, when a certain threshold voltage of the pull-down transistor is ensured, the first work function of the first work function layer may be increased by reducing the thickness of the first work function layer in the pull-down transistor. The first work function of the first work function layer may then be larger than the second work function of the second work function layer so that the concentration of the first doping ions may be reduced. Specifically, the concentration of the first doping ions may be reduced to be smaller than the concentration of the second doping ions, and thus the ratio between the saturation current of the pull-down transistor and the saturation current of the pass-gate transistor may be increased and the static noise margin of the memory may also be improved.

Moreover, when a certain threshold voltage of the pass-gate transistor is ensured, the second work function of the second work function layer may be reduced by increasing the thickness of the second work function layer. The second work function of the second work function layer may then be smaller than the first work function of the first work function layer so that the concentration of the second doping ions may be increased. Specifically, the concentration of the second doping ions may be increased to be greater than the concentration of the first doping ions, and thus the ratio between the saturation current of the pull-down transistor and the saturation current of the pass-gate transistor may be increased and the static noise margin of the memory may also be improved.

Figure 8:
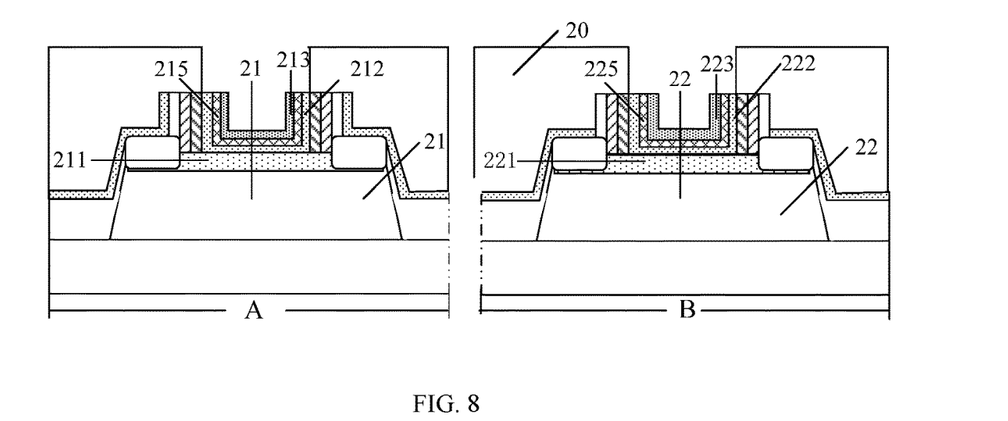
Figure 9:
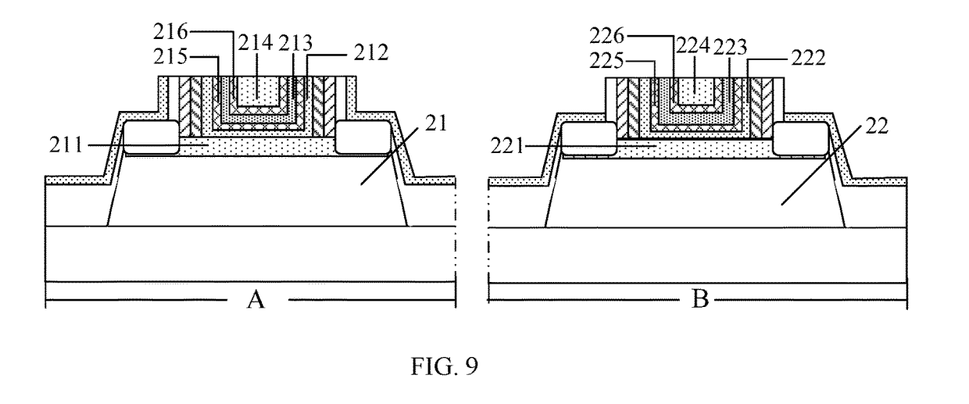
Figure 10:
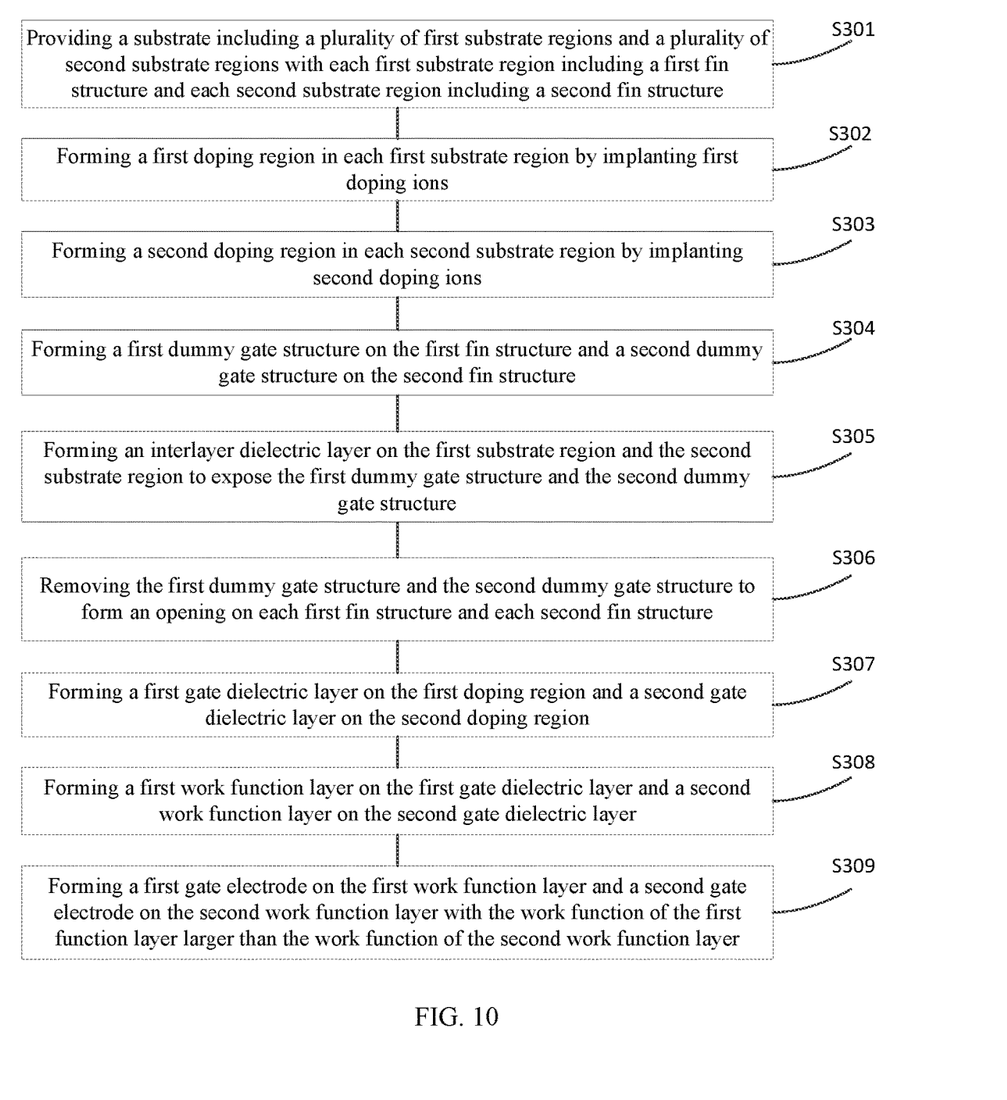
FIG. 10 illustrates a flowchart of an exemplary fabrication process consistent with disclosed embodiments.

The present disclosure also provides a method for fabricating an SRAM. FIG. 10 shows a flowchart of an exemplary fabrication method consistent with disclosed embodiments. FIGS. 4-9 show schematic views of semiconductor structures at certain stages of the exemplary fabrication process.

Figure 4:
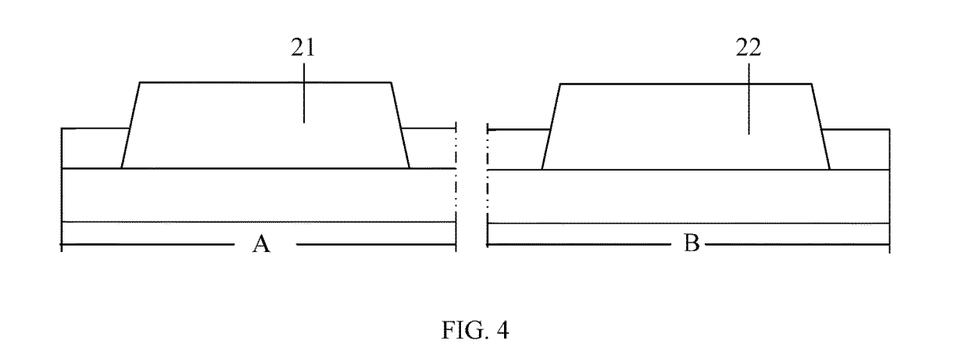
FIGS. 4-9 illustrate schematic views of semiconductor structures at certain stages of an exemplary fabrication process consistent with disclosed embodiments.

Referring to FIG. 10, at the beginning of the fabrication process, a substrate including a plurality of first substrate regions used to form pull-down transistors and a plurality of second substrate regions used to form pass-gate transistors may be provided (S301). FIG. 4 shows a schematic cross-section view of the corresponding semiconductor structure.

Referring to FIG. 4, a substrate is provided. The substrate may include a plurality of first substrate regions A used to form pull-down transistors and a plurality of second substrate regions B used to form pass-gate transistors. For illustration purposes, only one first substrate region A and one second substrate region B are shown in FIG. 4. The number of the first substrate regions A and the number of the second substrate regions B may be more than one. Moreover, for illustration purpose, the structure shown in FIG. 4 is described to have one pull-down transistor to be formed in the first substrate region A and one pass-gate transistor to be formed in the second substrate region B. The number of the pull-down transistors formed in each first substrate region A may be more than one while the number of the pass-gate transistors formed in each second substrate region B may also be more than one. For example, a pair of pull-down transistors sharing a fin structure may be formed in each first substrate region A while a pair of pass-gate transistors sharing a fin structure may be formed in each second substrate region B.

In one embodiment, the substrate is a silicon substrate. In other embodiment, the substrate may also be made of germanium, SiGe, SOI, or any other appropriate semiconductor.

In one embodiment, the pull-down transistor and the pass-gate transistor may be Fin-FETs. Accordingly, the substrate may also include a first fin structure 21 used to form the channel of the pull-down transistor in the first substrate region A and a second fin structure 22 used to form the channel of the pass-gate transistor in the second substrate region B.

In one embodiment, the fabrication process for the first fin structure 21 and the second fin structure 22 may include the following steps. First, a patterned mask layer may be formed on the substrate. Then, by etching the substrate using the mask layer as an etch mask, a first fin structure 21 may be formed in the first substrate region A and a second fin structure 22 may be formed in the second substrate region B.

In one embodiment, the substrate may be etched by a dry etching process. Dry etching process may have desired sectional control and linewidth control, and thus may be used to effectively control both the linewidth and the height of the first fin structure 21 and the second fin structure 22.

Figure 5:
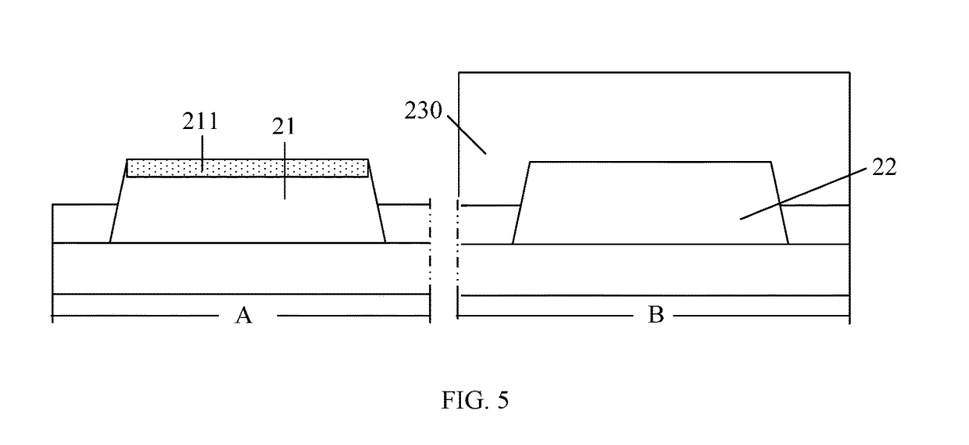

Further, returning to FIG. 10, a first doping region may be formed in the first substrate region by implanting first doping ions (S302). FIG. 5 shows a schematic cross-section view of the corresponding semiconductor structure.

Referring to FIG. 5, a first doping region 211 may be formed in the first substrate region A by implanting ions. The ions implanted into the first doping region 211 may be first doping ions.

In one embodiment, forming the first doping region 211 in the first substrate region A through ion implantation may include the following steps. First, a first photoresist layer 230 may be formed on the substrate. The first photoresist layer 230 may cover the second substrate region B and expose the first substrate region A. An ion implantation process may then be performed to implant the first doping ions into the first fin structure 21 to form the first doping region 211. Finally, the first photoresist layer 230 may be removed.

Specifically, the doping concentration of the first doping ions may not be too large or too small. When the doping concentration of the first doping ions is too large, charge carriers scattering in the channel of the pull-down transistor due to the first doping ions may be strong such that the saturation current of the pull-down transistor may be reduced, and thus the static noise margin of the memory may also be reduced. When the doping concentration of the first doping ions is too small, while ensuring a certain threshold voltage for the pull-down transistor, the thickness of a first function layer in the pull-down transistor may be too small so that the formation process for the first function layer may be difficult. Therefore, in one embodiment, the concentration of the first doping ions may be in a range between $10^{15}$ atom/cm$^{-3}$ and $10^{17}$ atom/cm$^{-3}$.

Figure 6:
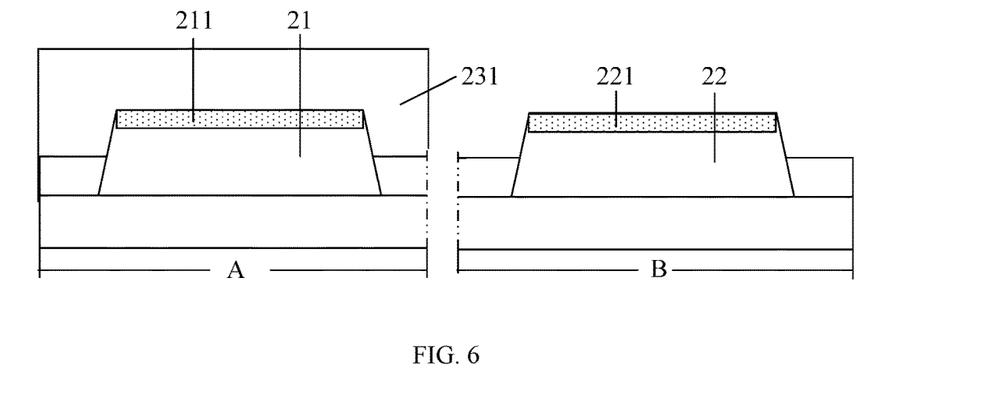

Further, returning to FIG. 10, a second doping region may be formed in the second substrate region by implanting second doping ions (S303). FIG. 6 shows a schematic cross-section view of the corresponding semiconductor structure.

Referring to FIG. 5, a second doping region 221 may be formed in the second substrate region B by implanting ions. The ions implanted into the second doping region 211 may be second doping ions.

In one embodiment, forming the second doping region 221 in the second substrate region B through ion implantation may include the following steps. First, a second photoresist layer 231 may be formed on the substrate. The second photoresist layer 231 may cover the first substrate region A and expose the second substrate region B. An ion implantation process may then be performed to implant the second doping ions into the second fin structure 22 to form the second doping region 221. Finally, the second photoresist layer 231 may be removed.

Specifically, the doping concentration of the second doping ions may not be too large or too small. When the doping concentration of the second doping ions is too small, charge carriers scattering in the channel of the pass-gate transistor due to the second doping ions may be weak, and thus the static noise margin of the memory may be reduced. When the doping concentration of the second doping ions is too large, the performance of the memory may be affected. Therefore, in one embodiment, the concentration of the second doping ions may be in a range between $10^{17}$ atom/cm$^{-3}$ and $10^{18}$ atom/cm$^{-3}$.

Returning to FIG. 10, further, a first dummy gate structure may be formed on the first fin structure and a second dummy gate structure may be formed on the second fin structure (S304).

In one embodiment, gate structures of the pull-down transistor and the pass-gate transistor may be formed through a gate last process. Therefore, after forming the first doping region 211 and the second doping region 221, the fabrication method may further include forming a first dummy gate structure on the first fin structure 21 and a second dummy gate structure on the second fin structure 22.

The first dummy gate structure may include a first dummy gate dielectric layer, a first dummy gate electrode, and a first sidewall spacer formed to cover the sidewalls of the first dummy gate electrode. The second dummy gate structure may include a second dummy gate dielectric layer, a second dummy gate electrode, and a second sidewall spacer formed to cover the sidewalls of the second dummy gate electrode.

Figure 7:
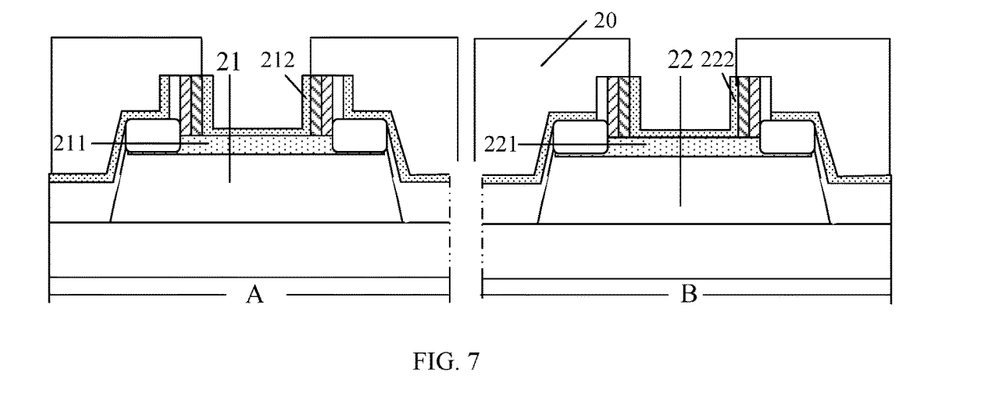

Further, returning to FIG. 10, an interlayer dielectric layer may be formed to cover the first substrate region and the second substrate region and expose the first dummy gate electrode and the second dummy gate electrode (S305). FIG. 7 shows a schematic view of a semiconductor structure with the interlayer dielectric layer formed on the first substrate region A and the second substrate region B.

Referring to FIG. 7, an interlayer dielectric layer 20 may be formed on the first substrate region A and the second substrate region B. The interlayer dielectric layer 20 may expose the first dummy gate electrode and the second dummy gate electrode.

Further, returning to FIG. 10, an opening may be formed on each of the first fin structure and the second fin structure by removing the first dummy gate structure and the second dummy gate structure (S306).

Referring to FIG. 7, the first dummy dielectric layer and the first dummy gate electrode as well as the second dummy dielectric layer and the second dummy gate electrode may be removed to form an opening on the first fin structure 21 and another opening on the second fin structure 22. The first sidewall spacer and the second sidewall spacer may not be removed. In a subsequent fabrication process, a first gate structure may be formed in the opening on the first fin structure 21 and a second gate structure may be formed in the opening on the second fin structure 22.

Returning to FIG. 10, further, a first gate dielectric layer may be formed on the first doping region and a second gate dielectric layer may be formed on the second doping region (S307).

Referring to FIG. 7, a first gate dielectric layer 212 may be formed on the first doping region 211 and a second gate dielectric layer 222 may be formed on the second doping region 221. The first gate dielectric layer 212 and the second gate dielectric layer 222 may be formed by a same material and/or the thickness of the first gate dielectric layer 212 may be the same as the thickness of the second gate dielectric layer 222.

In one embodiment, both the first gate dielectric layer 212 and the second gate dielectric layer 222 may have a multi-layer structure formed by a gate oxide layer and a high-k dielectric layer. The gate oxide layer may be used to reduce the interface-state density between the high-k dielectric layer and the corresponding first fin structure 21 or second fin structure 22. The high-k dielectric layer may reduce the leak current and impurity diffusion in the subsequently-formed pull-down transistor and pass-gate transistor, and thus may improve the integration level of the semiconductor device. The thickness of the first gate dielectric layer 212 and the thickness of the second gate dielectric layer 222 may in a range of 5 Å to 30 Å.

Further, returning to FIG. 10, a first work function layer may be formed on the first gate dielectric layer and then a second work function layer may be formed on the second dielectric layer (S308). FIG. 8 shows a schematic cross-section view of the corresponding semiconductor structure.

Referring to FIG. 8, a first work function layer 213 may be formed on the first gate dielectric layer 212. The first work function layer 213 may have a first work function.

The first work function layer 213 may be used to adjust the saturation current of the pull-down transistor and thus the static noise margin of the memory through the control of the threshold voltage of the pull-down transistor.

In one embodiment, the first work function layer 213 may be formed by a method including forming an initial first work function layer to cover both the first gate dielectric layer 212 and the second gate dielectric layer 222 through chemical vapor deposition (CVD). The portion of the initial first work function layer formed on the first gate dielectric layer 212 may be a first work function layer 213.

When a certain threshold voltage of the pull-down transistor is ensured, the beta ratio of the memory may be related to the first work function of the first work function layer 213. Further, in order to ensure a low concentration for the first doping ions 211 when the subsequently-formed pull-down transistor has a certain threshold voltage, the first work function layer 213 may be selected after comprehensively considering the influence of the subsequently-formed first gate electrode, the material and the thickness of each layer between the first electrode and the first fin structure 21 on the threshold voltage of the pull-down transistor. In one embodiment, by adjusting the material and the thickness of the first work function layer 213, the first work function layer 213 may have a relatively large first work function. Specifically, the first work function of the first work function layer 213 may be in a range between 4.3 V and 4.4 V.

In one embodiment, to ensure a relatively large first work function for the first work function layer 213 and also considering the requirement of the fabrication process for the first work function layer 213, the first work function layer 213 is made of a titanium-aluminum alloy. Specifically, in the titanium-aluminum alloy, the atomic percentage of aluminum atoms may be in a range of 50% to 60%. In other embodiments, the first work function layer 113 may be made of any other titanium-aluminum alloy with a different titanium-to-aluminum ratio, or may be made of any other appropriate material.

In one embodiment, in order to ensure the first work function of the first work function layer 213 in the range between 4.3 V and 4.4 V, the thickness of the first work function layer 213 may be in a range of 10 Å to 20 Å. In other embodiments, the thickness of the first work function layer may be selected based on the material of the first work function layer to ensure a desired large first work function for the first work function layer.

Further, a second work function layer 223 may be formed on the second gate dielectric layer 222. The second work function layer 223 may have a second work function. The second work function of the second work function layer 223 may be smaller than the first work function of the first work function layer 213.

The first work function may be larger than the second work function. As such, when certain threshold voltages of the pull-down transistor and the pass-gate transistor are ensured, the concentration of the first doping ions may be smaller than the concentration of the second doping ions. Therefore, the saturation current of the pull-down transistor may be larger than the saturation current of the pass-gate transistor, and thus the static noise margin of the memory may be improved.

The second work function layer 223 may be used to adjust the saturation current of the pass-gate transistor through the control of the threshold voltage of the pass-gate transistor 120.

When a certain threshold voltage of the pass-gate transistor is ensured, the beta ratio of the memory may be related to the second work function of the second work function layer 223. Further, in order to ensure a high concentration for the second doping ions when the pass-gate transistor has a certain threshold voltage, the second work function layer 223 may be selected after comprehensively considering the influence of the second gate electrode, the material and the thickness of each layer between the second electrode and the second fin structure 22 on the threshold voltage of the pass-gate transistor. In one embodiment, by adjusting the material and the thickness of the second work function layer 223, the second work function of the second work function layer 223 may have a certain value. Specifically, the second work function of the second work function layer 223 may be in a range between 4.2 V and 4.3 V.

In one embodiment, to ensure the certain value of the second work function for the second work function layer 223 and also considering the requirement of the fabrication process for the second work function layer 223, the second work function layer 223 may be made of the same material as the first work function layer 213 made of That is, the second work function layer 223 may also be made of a titanium-aluminum alloy. Specifically, in the titanium-aluminum alloy, the atomic percentage of aluminum atoms may be in a range of 50% to 60%. In other embodiments, the second work function layer 223 may be made of any other titanium-aluminum alloy with a different titanium-to-aluminum ratio, or may be made of any other appropriate material.

In an N-type transistor, a larger thickness of the work function layer may correspond to a smaller work function. In one embodiment, the first work function layer 213 and the second work function layer 223 are both made of a same material. In order to ensure the second work function of the second work function layer 223 smaller than the first work function of the first work function layer 213, the thickness of the second work function layer 223 may be larger than the thickness of the first work function layer 213. Specifically, the thickness of the second work function layer 223 may be in a range of 20 Å to 50 Å. In other embodiments, the thickness of the second work function layer may be selected based on the material of the second work function layer to ensure a smaller second work function for the second work function layer as compared to the first work function of the first work function layer.

In one embodiment, the second work function layer 223 and the first work function layer 213 may be made of a same material. The thickness of the second work function layer 223 may be larger than the thickness of the first work function layer 213. Accordingly, the formation process for the second work function layer 223 may include the following steps. First, a third photoresist layer may be formed to cover the first gate dielectric layer 212. The third photoresist layer may expose the second gate dielectric layer 222. Then, an initial second work function layer may be formed on the initial first work function layer through CVD. The portion of the initial first work function layer formed on the second gate dielectric layer 222 together with the portion of the initial second work function layer formed over the second gate dielectric layer 222 may form the second work function layer 223. Specifically, in one embodiment, the thickness of the second initial work function layer may be in a range between 0 Å and 40 Å.

In one embodiment, prior to forming the first work function layer 213 and the second work function layer 223, the fabrication method may also include forming a first cap layer 215 on the first gate dielectric layer 212 and a second cap layer 225 on the second gate dielectric layer 222.

The first cap layer 215 may be used to electrically isolate the first work function layer 213 from the first gate dielectric layer 212 while the second cap layer 225 may be used to electrically isolate the second work function layer 223 from the second gate dielectric layer 222.

In one embodiment, when certain threshold voltages of the pull-down transistor and the pass-gate transistor are ensured, the material of the first cap layer 215 may affect the saturation current of the pull-down transistor and the material of the second cap layer 225 may affect the saturation current of the pass-gate transistor. Therefore, the material of the first cap layer 215 and the material of the second cap layer 225 may affect the static noise margin of the memory. In one embodiment, in order to reduce the complexity of adjusting the saturation currents, the first cap layer 215 and the second cap layer 225 may be made of a same material used for forming cap layers in existing memories. Specifically, the first cap layer 215 and the second cap layer 225 may be both made of titanium nitride.

Further, when the thickness of the first cap layer 215 or the thickness of the second cap layer 225 is too small, the first cap layer 215 or the second cap layer 225 may not provide sufficient electrical isolation. However, when the thickness of the first cap layer 215 or the thickness of the second cap layer 225 is too large, the device design may not be conducive to integration. Therefore, in one embodiment, the thickness of the first cap layer 215 and the thickness of the second cap layer 225 are both in a range of 5 Å to 50 Å.

In one embodiment, the first cap layer 215 and the second cap layer 225 may be formed by a CVD process. In other embodiments, the first cap layer and the second cap layer may be formed by a physical vapor deposition (PVD) process, an atomic layer deposition (ALD) process, or any other appropriate process.

Further, returning to FIG. 10, a first gate electrode may be formed on the first work function layer and a second gate electrode may be formed on the second work function layer (S309). FIG. 9 shows a schematic cross-section view of the corresponding semiconductor structure.

Referring to FIG. 9, a first gate electrode 214 may be formed over the first work function layer 213 while a second gate electrode 224 may be formed over the second work function layer 223. In one embodiment, the first gate electrode 214 and the second gate electrode 224 may both be made of a titanium-aluminum alloy. The influence of the materials of the first gate electrode 214 and the second gate electrode 224 on the threshold voltages of the pull-down transistor and the pass-gate transistor may need to be considered when adjusting the first work function of the first work function layer 213 and the second work function of the second work function layer 223.

In one embodiment, prior to forming the first gate electrode 214 and the second gate electrode 224, the fabrication method may also include forming a third cap layer 216 on the first work function layer 213 and a fourth cap layer 226 on the second work function layer 223. The third cap layer 216 may be used to electrically isolate the first gate electrode 214 from the first work function layer 213, while the fourth cap layer 226 may be used to electrically isolate the second gate electrode 224 from the second work function layer 223.

In one embodiment, when certain threshold voltages of the pull-down transistor and the pass-gate transistor are ensured, the material of the third cap layer 216 may affect the saturation current of the pull-down transistor and the material of the fourth cap layer 226 may affect the saturation current of the pass-gate transistor. Therefore, the material of the first cap layer 215 and the material of the second cap layer 225 may affect the static noise margin of the memory. In one embodiment, in order to reduce the complexity of adjusting the saturation currents, the third cap layer 216 and the fourth cap layer 226 may be made of a same material used for forming cap layers in existing memories. Specifically, the third cap layer 216 and the fourth cap layer 226 may be both made of titanium nitride.

Further, when the thickness of the third cap layer 216 or the thickness of the fourth cap layer 226 is too small, the third cap layer 216 or the fourth cap layer 226 may not provide sufficient electrical isolation. However, when the thickness of the third cap layer 216 or the thickness of the fourth cap layer 226 is too large, the device design may not be conducive to integration. Therefore, in one embodiment, the thickness of the third cap layer 216 and the thickness of the fourth cap layer 226 are both in a range of 5 Å to 50 Å.

In one embodiment, the third cap layer 216 and the fourth cap layer 226 may be formed by a CVD process. In other embodiments, the third cap layer and the fourth cap layer may be formed by a physical vapor deposition (PVD) process, an atomic layer deposition (ALD) process, or any other appropriate process.

Compared to existing memories and fabrication methods, the disclosed SRAM and fabrication method may demonstrate the following advantages.

According to the disclosed fabrication method for an SRAM, the SRAM includes pull-down transistors formed in first substrate regions and pass-gate transistors formed in second substrate regions. Further, a first work function layer may be formed in each pull-down transistor and a second work function layer may be formed in each pass-gate transistor. The work function of the first work function layer may be larger than the work function of the second work function layer. In addition, the first substrate regions may be doped with first doping ions while the second substrate regions may be doped with second doping ions. The concentration of the first doping ions may be smaller than the concentration of the second doping ions so that the saturation current of the pull-down transistor may be larger than the saturation current of the pass-gate transistor. As such, the beta ratio of the memory may be increased and the static noise margin of the memory may be improved.

Further, according to the disclosed SRAM, the pull-down transistor in the SRAM may include a first work function layer and the pass-gate transistor in the SRAM may include a second work function layer. In addition, first substrate regions used to form pull-down transistors may be doped with first doping ions and second substrate regions used to form pass-gate transistor may be doped with second doping ions. By making the work function of the first work function layer larger than the work function of the second work function layer and the concentration of the first doping ions smaller than the concentration of the second doping ions, charge carrier scatting in the pull-down transistor due to impurity ions may be weaker than charge carrier scatting in the pass-gate transistor due to impurity ions. Therefore, the ratio between the saturation current of the pull-down transistor and the saturation current of the pass-gate transistor may be increased. As such, the beta ratio of the memory may be increased and the static noise margin of the memory may be improved.

Moreover, when a certain threshold voltage of the pull-down transistor is ensured, the work function of the first work function layer may be increased by reducing the thickness of the first work function layer. Specifically, when the work function of the first work function layer is greater than the work function of the second work function layer, the concentration of the first doping ions may be reduced so that the concentration of the first doping ions may be smaller than the concentration of the second doping ions. Therefore, the ratio between the saturation current of the pull-down transistor and the saturation current of the pass-gate transistor may be increased, and thus the static noise margin of the memory may be improved.

In addition, when a certain threshold voltage of the pass-gate transistor is ensued value, the work function of the second work function layer may be reduced by increasing the thickness of the second work function layer. Specifically, when the work function of the second work function layer is less than the work function of the first work function layer, the concentration of the second doping ions may be increased so that the concentration of the second doping ions may be larger than the concentration of the first doping ions. Therefore, the ratio between the saturation current of the pull-down transistor and the saturation current of the pass-gate transistor may be increased, and thus the static noise margin of the memory may be improved.

The above detailed descriptions only illustrate certain exemplary embodiments of the present invention, and are not intended to limit the scope of the present invention. Those skilled in the art can understand the specification as a whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a static random access memory (SRAM), comprising:
    providing a substrate including a plurality of first substrate regions and a plurality of second substrate regions;
    forming a first doped region in each first substrate region by implanting first doping ions;
    forming a second doped region in each second substrate region by implanting second doping ions;
    forming a plurality of pull-down transistors in the first substrate regions with each pull-down transistor including a first gate structure formed on the first doping region; and
    forming a plurality of pass-gate transistors in the second substrate regions with each pass-gate transistor including a second gate structure formed on the second doping region, wherein:
    a concentration of the first doping ions is smaller than a concentration of the second doping ions;
    forming the first gate structure includes forming a first gate dielectric layer on the first doping region, forming a first work function layer on the first gate dielectric layer, and forming a first gate electrode layer on the first work function layer;
    forming the second gate structure includes forming a second gate dielectric layer on the second doping region, forming a second work function layer on the second gate dielectric layer, and forming a second gate electrode layer on the second work function layer;
    a thickness of the first work function layer is less than a thickness of the second work function layer; and
    a work function of the first work function layer is greater than a work function of the second work function layer.

2. The method according to claim 1, wherein:
the thickness of the first work function layer is in a range of 10 Å to 20 Å; and
the thickness of the second work function layer is in a range of 20 Å to 50 Å.

3. The method according to claim 1, wherein:
the concentration of the first doping ions is in a range of $10^{15}$ atom/cm$^{-3}$ to $10^{17}$ atom/cm$^{-3}$; and
the concentration of the second doping ions is in a range of $10^{17}$ atom/cm$^{-3}$ to $10^{18}$ atom/cm$^{-3}$.

4. The method according to claim 1, wherein:
the first work function layer and the second work function layer are made of a titanium-aluminum alloy; and
an atomic percentage of aluminum in the titanium-aluminum alloy is in a range of 50% to 60%.

5. The method according to claim 1, further including a plurality of pull-up transistors formed on the substrate.

6. The method according to claim 1, wherein:
the plurality of pull-down transistors and the plurality of pass-gate transistors are NMOS transistors; and
the first doping ions and the second doping ions are boron ions.

7. The method according to claim 1, wherein:
the work function of the first work function layer is in a range of 4.3 V to 4.4 V; and
the work function of the second work function layer is in a range of 4.2 V to 4.3 V.

8. The method according to claim 1, wherein:
a threshold voltage of the pull-down transistor is in a range of 0.3 V to 0.4 V; and a threshold voltage of the pass-gate transistor is in a range of 0.3 V to 0.4 V.

9. The method according to claim 1, wherein:
each first substrate region includes a first fin structure;
each second substrate region includes a second fin structure;
the first gate structure is formed across the first fin structure and covering a top surface and two sidewall surfaces of the first fin structure; and
the second gate structure is formed across the second fin structure and covering a top surface and two sidewall surfaces of the second fin structure.

10. The method according to claim 1, wherein:
the first gate electrode and the second gate electrode are made of a titanium-aluminum alloy; and
the first gate dielectric layer and the second gate dielectric layer both have a multi-layer structure including a gate oxide layer and a high-k dielectric layer formed on the gate oxide layer.

11. The method according to claim 1, wherein:
a thickness of the first gate dielectric layer and a thickness of the second gate dielectric layer are both in a range of 5 Å to 30 Å.

12. The method according to claim 1, wherein:
the first gate structure also includes a first cap layer formed between the first gate dielectric layer and the first work function layer, and a third cap layer formed between the first work function layer and the first gate electrode; and
the second gate structure also includes a second cap layer formed between the second gate dielectric layer and the second work function layer, and a fourth cap layer formed between the second work function layer and the second gate electrode.

13. The method according to claim 1, wherein the first cap layer, the second cap layer, the third cap layer, and the fourth cap layer are all made of titanium nitride.

14. The method according to claim 13, wherein the thicknesses of the first cap layer, the second cap layer, the third cap layer, and the fourth cap layer are all in a range of 5 Å to 50 Å.

15. The method according to claim 12, wherein:
the first cap layer electrically isolates the first work function layer from the first gate dielectric layer, and
the third cap layer electrically isolates the first work function layer from the first gate electrode.

16. The method according to claim 12, wherein:
the second cap layer electrically isolates the second work function layer from the second gate dielectric layer,
the fourth cap layer electrically isolates the second work function layer from the second gate electrode.

17. The method according to claim 12, wherein:
the fourth cap layer has a same thickness of the third cap layer.

18. The method according to claim 1, wherein a threshold voltage of the pull-down transistor and the pass-gate transistor are approximately a half of a working voltage of the pull-down transistor.

19. The method according to claim 1, wherein a threshold voltage of the pass-gate transistor are approximately a half of a working voltage of the pass-gate transistor.

* * * * *